(12) United States Patent
Asari et al.

(10) Patent No.: US 8,672,602 B2
(45) Date of Patent: Mar. 18, 2014

(54) VERTICAL THERMAL PROCESSING APPARATUS

(75) Inventors: Satoshi Asari, Oshu (JP); Kiichi Takahashi, Oshu (JP); Toshihiro Abe, Oshu (JP)

(73) Assignee: Tokyo Electron Limited, Minato-Ku (JP)

( * ) Notice: Subject to any disclaimer, the term of this patent is extended or adjusted under 35 U.S.C. 154(b) by 577 days.

(21) Appl. No.: 12/549,455

(22) Filed: Aug. 28, 2009

(65) Prior Publication Data

US 2010/0061828 A1    Mar. 11, 2010

(30) Foreign Application Priority Data

Sep. 5, 2008  (JP) ................. 2008-228429

(51) Int. Cl.
*B66F 19/00* (2006.01)
(52) U.S. Cl.
USPC .......................................... 414/160; 294/213
(58) Field of Classification Search
USPC ................... 294/213; 414/147, 160
See application file for complete search history.

(56) References Cited

U.S. PATENT DOCUMENTS

| | | | |
|---|---|---|---|
| 5,316,472 A | | 5/1994 | Niino et al. |
| 5,326,472 A | | 7/1994 | Combe |
| 5,711,646 A | * | 1/1998 | Ueda et al. ............... 414/222.13 |
| 5,746,460 A | * | 5/1998 | Marohl et al. ................. 294/213 |
| 5,957,651 A | | 9/1999 | Takebayashi et al. |
| 6,578,891 B1 | * | 6/2003 | Suzuki et al. ................. 294/185 |
| 6,634,686 B2 | * | 10/2003 | Hosokawa .................... 294/213 |
| 6,692,049 B2 | * | 2/2004 | Holbrooks ................. 294/103.1 |
| 7,182,201 B2 | | 2/2007 | Fujimura et al. |
| 7,290,813 B2 | * | 11/2007 | Bonora et al. ................. 294/213 |
| 7,641,247 B2 | * | 1/2010 | Blonigan et al. .............. 294/213 |
| 7,654,596 B2 | * | 2/2010 | Mantz ........................ 294/103.1 |
| 7,717,481 B2 | * | 5/2010 | Ng ................................. 294/213 |
| 7,878,562 B2 | * | 2/2011 | Hamano et al. ................ 294/213 |
| 8,109,549 B2 | | 2/2012 | Mantz |
| 2005/0006916 A1 | | 1/2005 | Mantz |

(Continued)

FOREIGN PATENT DOCUMENTS

| | | |
|---|---|---|
| CN | 1531049 A | 9/2004 |
| CN | 1813335 A | 8/2006 |

(Continued)

OTHER PUBLICATIONS

Chinese Office Action dated Oct. 9, 2012.

(Continued)

*Primary Examiner* — Joshua Rudawitz
(74) *Attorney, Agent, or Firm* — Burr & Brown, PLLC

(57) ABSTRACT

The present invention is a processing apparatus comprising a transfer mechanism including at least one transfer plate, the transfer mechanism being configured to cause, when a substrate to be processed is placed on an upper surface of the transfer plate, the transfer plate to move while maintaining the substrate to be processed placed horizontally thereon. The transfer plate has a cantilevered support structure horizontally extending from a proximal end thereof to a distal end thereof in a fore and aft direction. An upper surface of the transfer plate is provided with a plurality of support projections configured to horizontally support the substrate to be processed at a substantially central position thereof and a rear position thereof in the fore and aft direction. The substrate to be processed is not supported on the distal portion of the transfer plate.

8 Claims, 7 Drawing Sheets

(56) References Cited

U.S. PATENT DOCUMENTS

| | | | |
|---|---|---|---|
| 2006/0113806 A1* | 6/2006 | Tsuji et al. | 294/1.1 |
| 2006/0182530 A1* | 8/2006 | Wang | 414/217 |
| 2006/0182561 A1* | 8/2006 | Pen | 414/416.03 |
| 2006/0239799 A1* | 10/2006 | Jang et al. | 414/147 |
| 2007/0183868 A1 | 8/2007 | Son | |
| 2007/0227033 A1 | 10/2007 | Kobayashi et al. | |
| 2007/0238062 A1 | 10/2007 | Asari et al. | |
| 2010/0290886 A1* | 11/2010 | Hashimoto et al. | 414/800 |
| 2012/0126555 A1 | 5/2012 | Mantz | |

FOREIGN PATENT DOCUMENTS

| | | |
|---|---|---|
| CN | 1824592 A | 8/2006 |
| CN | 101017790 A1 | 8/2007 |
| EP | 0 477 897 A2 | 4/1992 |
| JP | 04-133417 A1 | 5/1992 |
| JP | 2001-044260 | 2/2001 |
| JP | 3234617 | 12/2001 |
| JP | 2002-264065 A1 | 9/2002 |
| JP | 2003-124300 A1 | 4/2003 |
| JP | 2007-525001 A1 | 8/2007 |
| JP | 2007-273620 A1 | 10/2007 |
| KR | 10-2006-0026444 A | 3/2006 |
| KR | 10-2007-0095208 A | 9/2007 |
| TW | 200809976 | 2/2008 |
| WO | 96/42108 A1 | 12/1996 |
| WO | 2005/010956 A2 | 2/2005 |

OTHER PUBLICATIONS

Korean Office Action dated Sep. 14, 2012.
Chinese Office Action dated May 2, 2013.

* cited by examiner

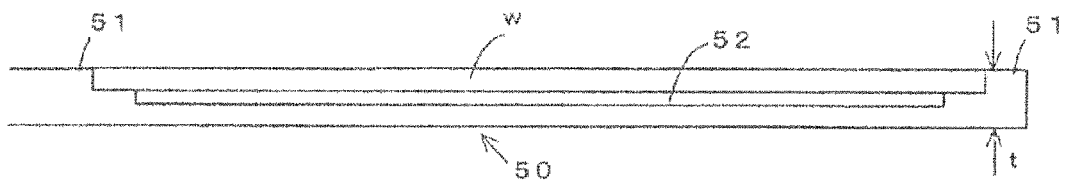
FIG. 10A - PRIOR ART
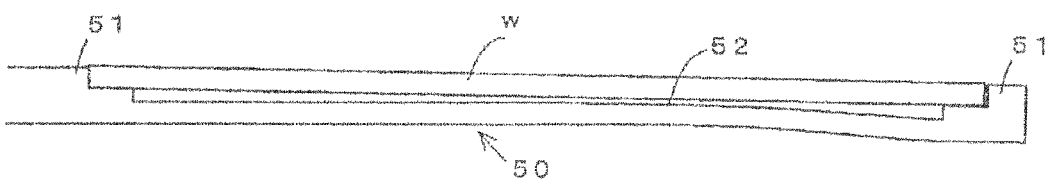
FIG. 10B - PRIOR ART

VERTICAL THERMAL PROCESSING APPARATUS

CROSS REFERENCE TO RELATED APPLICATIONS

This application is based upon and claims the benefit of priority from the prior Japanese Patent Application No. 2008-228429 filed on Sep. 5, 2008, the entire contents of which are incorporated herein by reference.

FIELD OF THE INVENTION

The present invention relates to a vertical thermal processing apparatus configured to thermally process a substrate to be processed.

BACKGROUND OF THE INVENTION

In a manufacturing process of semiconductor devices, various processing apparatuses (semiconductor manufacturing apparatuses) are used for subjecting substrates to be processed, such as semiconductor wafers (hereinafter referred to as "wafers") to processes such as oxidation processes, diffusion processes, and CVD (Chemical Vapor Deposition) processes. As one of these apparatuses, there has been known a batch-type of vertical thermal processing apparatus, which is capable of thermally processing a number of substrates to be processed at the same time.

The batch-type of vertical thermal processing apparatus includes: a thermal processing furnace; a substrate supporter (also referred to as "boat") that is loaded to and unloaded from the thermal processing furnace, while supporting a plurality of wafers with predetermined intervals therebetween in a vertical direction; and a transfer mechanism configured to transfer a plurality of wafers between the boat and a container (also referred to as FOUP) capable of containing a plurality of wafers with predetermined intervals therebetween. The transfer mechanism includes: a base table capable of being elevated, lowered, and rotated; and a plurality of transfer plates (also referred to as "forks") for supporting wafers, the transfer plates being disposed on the base table such that the transfer plates can be moved forward and rearward.

As methods for transferring the plurality of wafers by the transfer mechanism, there are a soft landing method (method for softly transferring the plurality of wafers) which does not have an aligning (positioning) function, and an edge grip method (method for accurately and promptly transferring the plurality of wafers while gripping an edge of each wafer) which has an aligning function.

As a boat, there has been known, in addition to a type of boat in which the plurality of wafers are respectively supported by a plurality of grooves or projections that are formed on a plurality of support columns, another type of boat in which the plurality of wafers are respectively supported on a plurality of annular plates (ring plates) having a diameter larger than that of the wafer via a plurality of substrate support pieces (see, JP4-133417A, for example). According to the latter type of boat, a desired film can be formed on each wafer without being influenced by the support columns, whereby an in-plane uniformity of the film thickness can be improved. In addition, a transfer operation of the transfer mechanism can be facilitated and accelerated.

FIG. 10A is a schematic side view of a conventional fork. FIG. 10B is a schematic side view of the conventional fork 50 in a state wherein a distal portion thereof is bent. As shown in FIGS. 10A and 10B, a regulation part 51 of about 0.8 mm in height for regulating a peripheral portion of a wafer w is disposed on an upper side of the fork 50 at a position thereof corresponding to the peripheral portion of a wafer w. In addition, the fork 50 is provided with a step or a recess 52 of about 0.5 to 1 mm in height at an area to be overlapped by the wafer w excluding the peripheral portion thereof, in order that, even when the fork 50 and/or the wafer w are bent, the fork 50 and the wafer w are not brought into undesired contact with each other. Because of this shape, a total thickness t of the fork 50 is as large as about 3 mm. When the load (weight) of a wafer is applied to the distal portion of the fork 50 having such a shape, the fork 50 is bent with a relatively large bending amount.

As described above, in the conventional vertical thermal processing apparatus, the thickness of each fork of the transfer mechanism is large, and the bending amount thereof is also large. Thus, it is difficult to transfer a plurality of wafers to a boat of narrow pitches. In particular, when a ring boat is used, only a limited number of wafers can be transferred, i.e., the number of wafers to be processed is undesirably limited (the uppermost limit is at most about 75 wafers).

SUMMARY OF THE INVENTION

The present invention has been made in view of the above circumstances. The object of the present invention is to provide a vertical thermal processing apparatus capable of transferring a plurality of wafers to a boat of narrow pitches, by reducing a bending amount and a thickness of a transfer plate, whereby the number of wafers to be processed can be increased.

The present invention is a processing apparatus comprising a transfer mechanism including at least one transfer plate, the transfer mechanism being configured to cause, when a substrate to be processed is placed on an upper surface of the transfer plate, the transfer plate to move while maintaining the substrate to be processed placed horizontally thereon, wherein: the transfer plate has a cantilevered support structure horizontally extending from a proximal end thereof to a distal end thereof in a fore and aft direction; an upper surface of the transfer plate is provided with a plurality of support projections configured to horizontally support the substrate to be processed at a substantially central position thereof and a rear position thereof in the fore and aft direction, and the substrate to be processed is not supported on the distal portion of the transfer plate.

According to the present invention, since a bending amount and a thickness of the transfer plate can be reduced, a plurality of wafers can be transferred to a boat of narrower pitches, whereby the number of wafers to be processed can be increased.

Alternatively, the present invention is a vertical thermal processing apparatus comprising: a substrate supporter capable of supporting a plurality of substrates to be processed at predetermined intervals therebetween in a vertical direction; a transfer mechanism including at least one transfer plate configured to transfer a plurality of substrates to be processed between the substrate supporter and a container capable of containing a plurality of substrates to be processed; and a thermal processing furnace configured to thermally process the plurality of substrates to be processed that have been loaded thereinto together with the substrate supporter; wherein: the transfer plate has a cantilevered support structure horizontally extending from a proximal end thereof to a distal end thereof in a fore and aft direction; an upper surface of the transfer plate is provided with plurality of support projections configured to horizontally support the substrate to be processed at a substantially central position thereof and a rear position thereof in the fore and aft direction, and the substrate to be processed is not supported on the distal portion of the transfer plate.

According to the present invention, since a bending amount and a thickness of the transfer plate can be reduced, a plurality of wafers can be transferred to a boat of narrower pitches, whereby the number of wafers to be processed can be increased.

Preferably, the transfer plate is provided with a step in a lower surface thereof at a region more distal than the substantially central support projection, so that a thickness of this region is smaller than a thickness of the other region.

In addition, preferably, each of the plurality of support projections is made of a heat resistant resin, and is formed into a flat, small circular shape.

In addition, preferably, the transfer plate has a substantially U-shape in plan view; the support projections at the substantially central position are disposed on two right and left locations on the upper surface of the transfer plate; and the support projection at the rear position is disposed on one central location on a proximal side of the transfer plate.

In addition, preferably, the upper surface of the transfer plate on the distal end is provided with a regulation piece that regulates a peripheral portion of the substrate to be processed so as not to allow the substrate to be processed to move in the forward direction and the right and left direction; and the upper surface of the transfer plate on a proximal side is provided with a gripping mechanism capable of moving forward and rearward so as to grip the substrate to be processed between the gripping mechanism and the regulation piece, so as not to allow the substrate to be processed to move in the rear direction.

BRIEF DESCRIPTION OF THE DRAWINGS

FIG. 10A is a schematic side view of a conventional fork; and

FIG. 10B is a schematic side view of the conventional fork in a state wherein a distal portion thereof is bent.

DETAILED DESCRIPTION OF THE INVENTION

Figure 1:
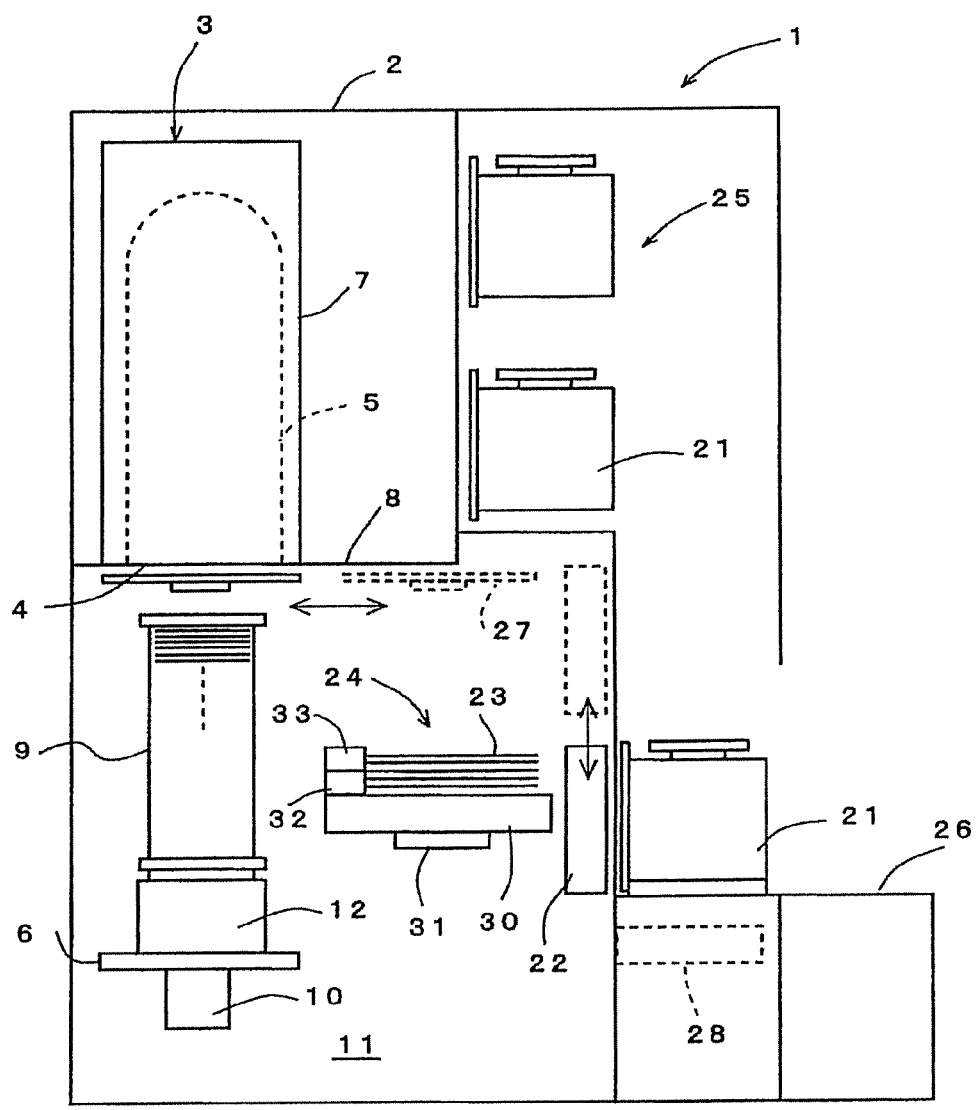
FIG. 1 is a longitudinally sectional view schematically showing a vertical thermal processing apparatus in one embodiment of the present invention.

The best mode for carrying out the present invention will be described herebelow with reference to the attached drawings. FIG. 1 is a longitudinally sectional view schematically showing a vertical thermal processing apparatus in one embodiment of the present invention.

As shown in FIG. 1, the vertical thermal processing apparatus 1 includes a housing 2 defining an outer profile. Disposed in an upper part of the housing 2 is a vertical thermal processing furnace 3 configured to accommodate a plurality of substrates to be processed, such as thin circular semiconductor wafers w, and to perform thereto a predetermined process, such as a CVD process. The thermal processing furnace 3 is mainly composed of: a reaction tube 5 made of e.g., quartz, which is a longitudinal processing container (vessel) having a lower opening as a furnace opening 4; a lid member 6 capable of being elevated and lowered so as to close and open the furnace opening 4 of the reaction tube 5; and a heater (heating device) 7 disposed to surround a circumference of the reaction tube 5 so as to heat an inside of the reaction tube 5 to a predetermined temperature of, e.g., 300° C. to 1200° C.

In the housing 2, there are horizontally disposed the reaction tube 5 constituting the thermal processing furnace 3, and a base plate 8 made of, e.g., SUS, on which the heater 7 can be placed. The base plate 8 has an opening, not shown, through which the reaction tube 5 can be inserted upward from below.

An outward flange part is formed on a lower end of the reaction tube 5. When this flange part is held (secured) by a flange holding member onto the base plate 8, the reaction tube 5 is fixed to the base plate 8 in a state wherein the reaction tube 5 has been inserted upward through the opening of the base plate 8 from below. The reaction tube 5 can be detached downward from the base plate 8 so as to be cleaned, etc. Connected to the reaction tube 5 are a plurality of gas inlet pipes, through which a process gas and an inert gas for purging are introduced, and a drain pipe having a vacuum pump and a pressure control valve (illustration omitted), which are capable of reducing a pressure in the reaction tube 5. Alternatively, a cylindrical manifold having a gas inlet port and a drain port, to which a plurality of gas inlet pipes and a drain pipe can be connected, may be connected to a lower end of the reaction tube 5. In this case, the manifold defines the furnace opening.

A loading area (operation region) 11 is disposed below the base plate 8 in the housing 2. In the loading area 11, a boat (substrate supporter) 9 placed on the lid member 6 via a heat retaining tube is loaded into the thermal processing furnace 3 (i.e., the reaction tube 5) and is unloaded from the thermal processing furnace 3. In addition, in the loading area 11, a plurality of wafers w are transferred to or from the boat 9. The loading area 11 is equipped with an elevating and lowering mechanism 10 for elevating and lowering the lid member 6 so as to load and unload the boat 9.

The lid member 6 is configured to be brought into contact with the opening end of the furnace opening 4 so as to hermetically seal the furnace opening 4. An upper part of the lid member 6 can receive the boat 9 via the heat retaining tube 12. The heat retaining tube 12 is a means for preventing heat release from the furnace opening 4. Disposed on the upper part of the lid member 6 is a turn table, not shown, capable of being turned (rotated), on which the heat retaining tube 12 is placed. Further, disposed below the lid member 6 is a turning mechanism, not shown, for turning (rotating) the turn table.

The boat 9 is made of, e.g., quartz, and is capable of horizontally supporting a plurality of wafers w of a large diameter, e.g., 300-mm diameter, by means of a plurality of ring-shaped support plates 13, in a tier-like manner, at predetermined intervals P, e.g., at a pitch of 9 to 15 mm, preferably 11.5 mm, in an up and down (vertical) direction. The boat 9 is composed of a circular or annular bottom plate 14, a circular or annular top plate 15, and a plurality of, e.g., four rod-like support columns 16 interposed between the bottom plate 14 and the top plate 15. Among the plurality of support columns 16, a distance between a pair of right and left support columns, which are positioned on both sides for a direction where the wafers are transferred (see, FIG. 2), is set so wide that the wafers can be transferred in the transfer direction (horizontal direction) and that the ring-shaped support plates 13 can be mounted and dismounted.

Figure 2:
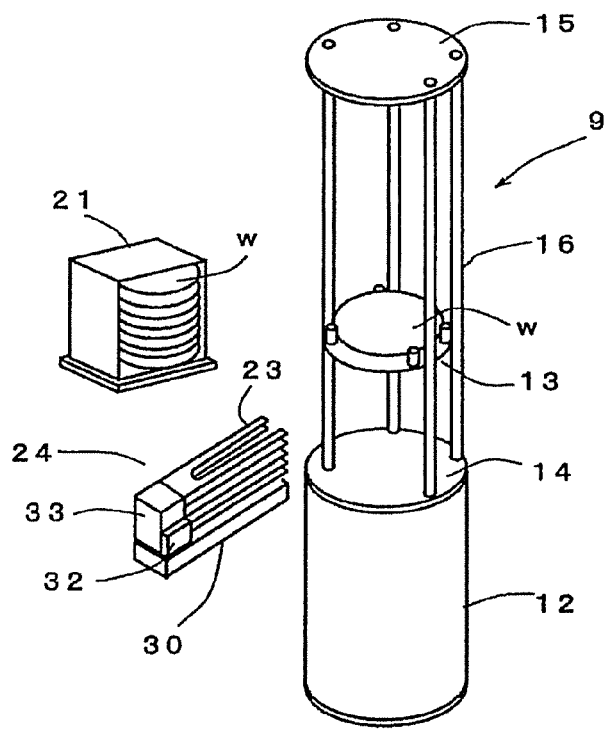
FIG. 2 is a schematic perspective view for explaining a transfer operation.
Figure 3:
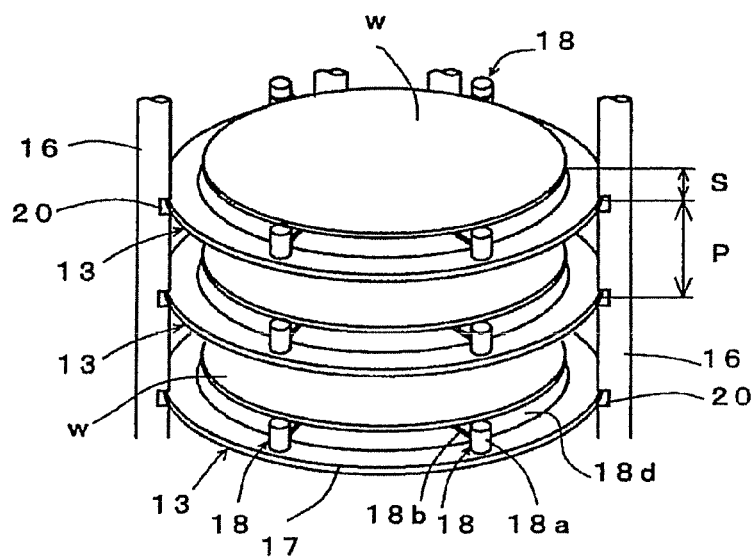
FIG. 3 is an enlarged perspective view showing an example of a boat.
Figure 4:
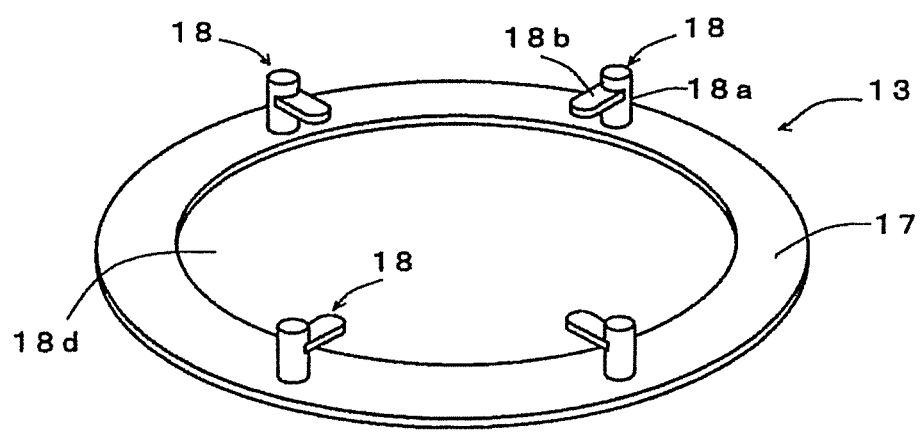
FIG. 4 is a perspective view of a ring-shaped support plate.

FIG. 2 is a schematic perspective view for explaining a transfer operation. FIG. 3 is an enlarged perspective view showing an example of the boat. FIG. 4 is a perspective view of the ring-shaped support plate. As shown in these drawings, the ring-shaped support plate 13 includes an annular plate (ring plate) 17 having a diameter larger than that of the wafer w, and a plurality of, e.g., four substrate support pieces 18 disposed on the annular plate 17 so as to project therefrom. Due to the substrate support pieces 18, while the peripheral portion of the wafer w is locked, the wafer W is supported such that a gap S (predetermined clearance of e.g., about 3 to 10 mm, preferably 6 mm) is maintained between the wafer w and the annular plate 17. As the ring-shaped support plate 13, a publicly known support plate (see, for example, JP4-133417A) can be used. The ring-shaped support plate 13 is made of, e.g., quartz. However, the boat 9 and the ring-shaped support plate 13 may be made of silicon carbide. Alternatively, the support plate 13 may be made of alumina.

The annular plate 17 has a thickness of, e.g., about 3 mm, an outer diameter of, e.g., about 320 mm, and an inner diameter of an opening 18d of e.g., about 300 mm. Depending on cases, the inner diameter of the opening 18d may be slightly larger than the diameter of the wafer w, or may be slightly smaller than the diameter of the wafer. The substrate support piece 18 is composed of a columnar member (standing-up portion) 18a projectingly secured on the annular plate 17, and a plate-shaped member (support portion) 18b disposed to substantially horizontally project from the columnar member 18a inward the annular plate 17 (toward the center thereof). The lower surface of the peripheral portion of the wafer w can be supported by the plate-shaped member 18b. In order that the ring-shaped support plates 13 as structured above are mounted on the boat 9, the support columns 16 are provided with grooves 20 or projections for respectively supporting the outer peripheries of the annular plates 17 at predetermined pitches P in the up and down direction.

In front of the housing 2, there is disposed a stage (load port) 26 on which a container 21, which is capable of containing a plurality of, e.g., twenty five wafers at predetermined intervals therebetween, can be placed for loading and unloading the plurality of wafers to and from the housing 2. The container 21 is a hermetically sealable container (also referred to as "FOUP") having a cover on a front surface thereof, the cover being attachable and detachable to and from the container 21. In a front part of the loading area 11, there is disposed a door mechanism 22 configured to detach the cover of the container 21 so as to communicate the inside of the container 21 with the loading area 11. In addition, disposed in the loading area 11 is a transfer mechanism 24 having a plurality of forks (transfer plates) 23, which are arranged at predetermined intervals, for transferring the wafers w between the container 21 and the boat 9.

Outside the loading area 11 and at a front upper portion in the housing 2, there are a storage shelf part 25, in which the containers 21 can be stored, and a conveyance mechanism, not shown, for conveying the containers 21 from the stage 26 to the storage shelf part 25 and vice versa. A shutter mechanism 27 is disposed in an upper portion of the loading area 11. When the lid member 6 is lowered so that the furnace opening 4 is opened, the shutter mechanism 27 covers (or blocks) the furnace opening 4 so as to restrain or prevent release of a high-temperature heat from the furnace opening 4. Disposed in a lower part of the stage 26 is an aligning device (aligner) 28 capable of aligning cutouts (notches) formed in outer circumferences of the wafers w to be transferred by the transfer mechanism 24.

The transfer mechanism 24 has a plurality of, e.g., five transfer plates (also referred to as "forks") 23 for supporting a plurality of, e.g., five wafers at predetermined intervals therebetween in the up and down direction. In this case, the middle fork can independently move forward and rearward. Meanwhile, the other forks (first, second, fourth, and fifth forks) can integrally move forward and rearward, and also pitches therebetween in the up and down direction can be steplessly changed by a pitch change mechanism, with the middle fork as a reference. This is because the transfer mechanism 24 can cope with a case in which the pitches between wafers contained in the container 21 and the pitches between wafers supported by the boat 9 are different from each other. Even in this case, a plurality of wafers can be simultaneously transferred between the container 21 and the boat 9 with the aid of the pitch change mechanism.

The transfer mechanism 24 has a base table 30 capable of being elevated, lowered, and rotated. To be specific, the transfer mechanism 24 has an elevating and lowering arm 31 capable of moving in the up and down direction (capable of elevating and lowering) by means of a ball screw or the like. A box-like base table 30 is mounted on the elevating and lowering arm 31 such that the base table 30 can be horizontally rotated. On the base table 30, a first move-driving member 32 capable of causing the middle one fork 23 to move forward and rearward, and a second move-driving member 33 capable of causing the two forks disposed above the middle fork and the two forks disposed therebelow, i.e., the four forks 23 to move forward and rearward, are disposed along a longitudinal direction of the base table 30, i.e., along the horizontal direction. Thus, a single-wafer transfer mode in which one wafer is transferred by an independent operation of the first move-driving member 32, and a batch transfer mode in which five wafers are simultaneously transferred by a cooperation of the first and the second move-driving members 32, 33, can be selectively performed. In order to respectively operate the first and the second move-driving mechanism 32, 33, a move-driving mechanism, not shown, is disposed in the base table 30. As the move-driving mechanism and the pitch change (pitch-changing) mechanism, the mechanisms of a type described in JP2001-44260A, for example, may be used.

The transfer mechanism 24 has a coordinate system (coordinate axes) of an up and down axis (z axis), a rotational axis (θ axis), and a fore and aft axis (x axis). In addition, the transfer mechanism 24 has respective driving systems for causing the base table 30 to move in the direction of the up and down axis, for rotating the base table 30 about the rotational axis, for causing the forks 23 to move in the fore and aft direction via the first and the second move-driving members 32 and 33, and for changing the pitches between the forks 23.

Figure 5A:
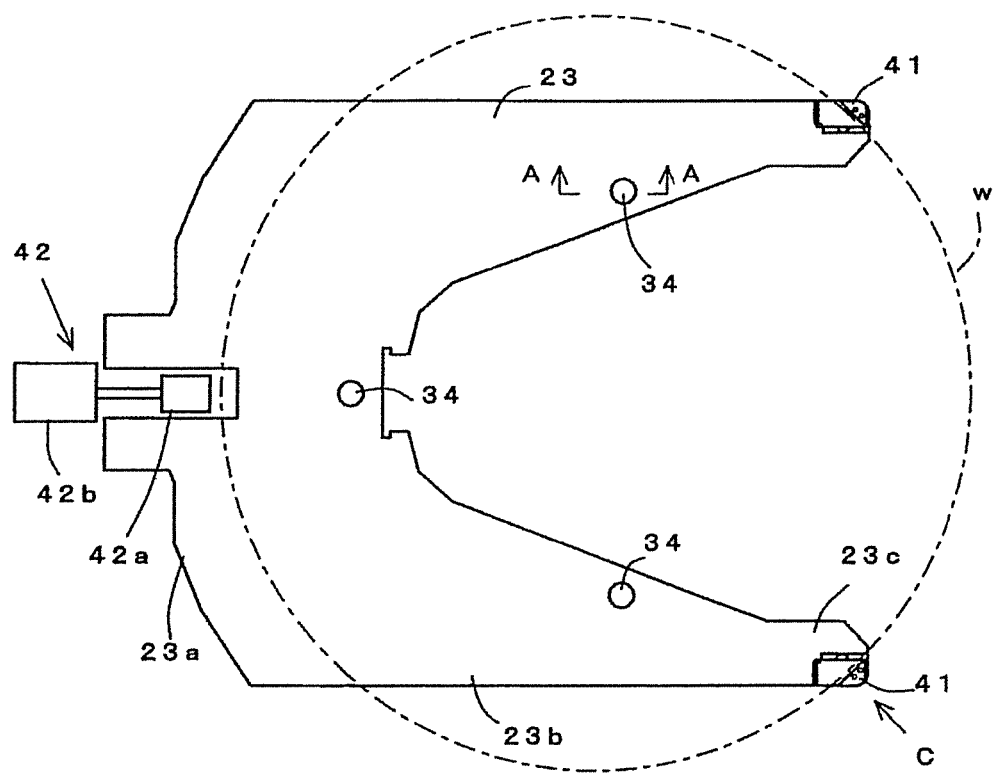
FIG. 5A is a plan view of a transfer plate.
Figure 5B:
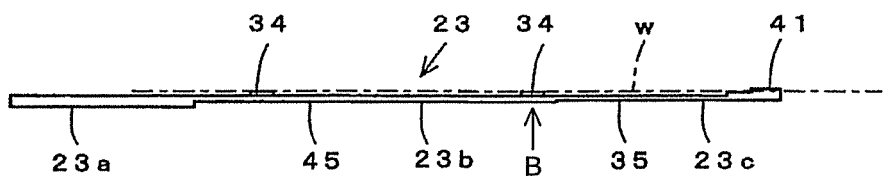
FIG. 5B is a side view of the transfer plate.
Figure 8A:
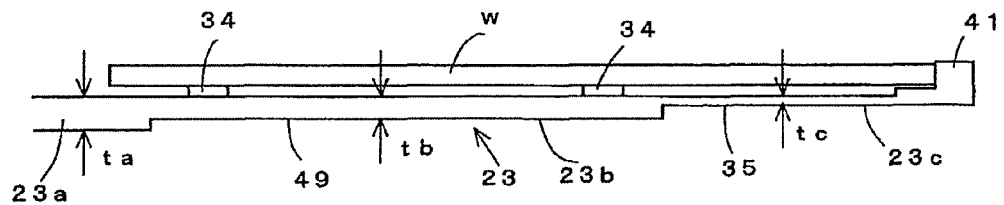
FIG. 8A is a schematic side view of the transfer plate.
Figure 8B:
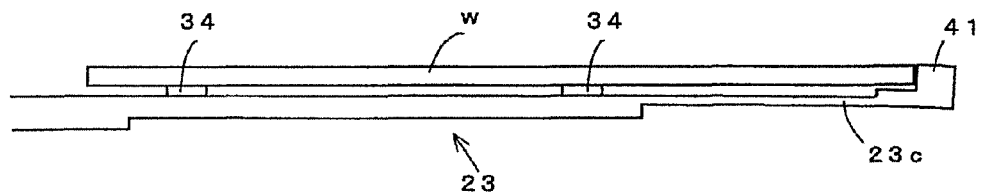
FIG. 8B is a schematic side view of the transfer plate in a state wherein a distal portion of the transfer plate is bent.

As shown in FIGS. 5A, 5B, and 8A, the fork 23 is of a cantilevered support structure horizontally extending from a proximal end (left side in the drawings) to a distal end (right side in the drawings) in the fore and aft direction. Disposed on an upper surface of the fork 23 are a plurality of support projections 34 for horizontally supporting a wafer w, at substantially central positions thereof and a rear position thereof in the fore and aft direction. The load (weight) of the wafer w is not supported on the distal side of the fork 23.

A step 35 is formed in a lower surface of the fork 23 at a region more distal than the substantially central support projections 34. Thus, a thickness tc of this region is formed smaller than a thickness of another part, e.g., a thickness ta of a proximal part. The illustrated fork 23 is formed such that the thickness ta of the proximal part (proximal side) 23a, a thickness tb of an intermediate part (between the substantially central support projections and the rear support projection) 23b, and the thickness tc of the distal part (distal side) 23c are reduced stepwise in this order. For example, ta=2.3 mm, tb=1.2 mm, and tc=0.8 mm.

The fork 23 is made of, e.g., alumina ceramics and has an elongated thin plate-like shape. In detail, the fork 23 has a substantially U-shape in plan view with a distal side from the intermediate part being divided into two. The substantially central support projections 34 are disposed on a right and a left locations on the upper surface of the intermediate part, and the rear support projection 34 is disposed on one central location on the proximal part.

Figure 6A:
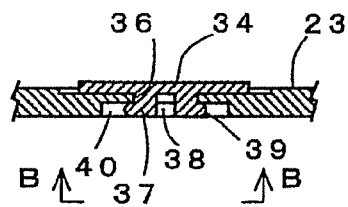
FIG. 6A is an enlarged sectional view taken along the line A-A in FIG. 5A.
Figure 6B:
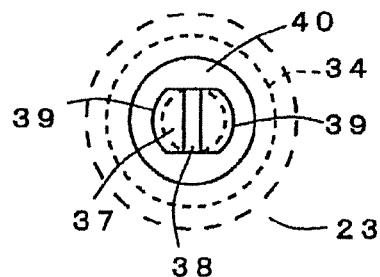
FIG. 6B is a bottom view of the transfer plate as seen from the direction B in FIG. 5B.

As shown in FIGS. 6A and 6B, the support projection 34 is made of a heat-resistant resin such as a PEEK (Poly Ether Ether Ketone) material, and is formed into a flat (projecting height from the upper surface of the fork is about 0.3 mm), small circular shape (diameter is about 2 mm). In order that such a support projection 34 is detachably (exchangeably) attached, the fork 23 has an attachment hole 36, and the support projection 34 has a fitting part 37 at a central portion of the lower surface thereof to be fitted in the attachment hole 36. In order to improve the attachment properties, the fitting part 37 is provided with a dividing groove 38, which equally divides the fitting part 37 into two. In addition, the fitting part 37 has two (opposed) flange parts 39 to be engaged with the lower surface of the peripheral portion of the attachment hole 36. Further, a recess 40 capable of accommodating the flange parts 39 of each support projection 34 is formed in the lower surface of the fork 23, such that the flange parts 39 do not project from the lower surface of the fork 23.

Figure 7A:
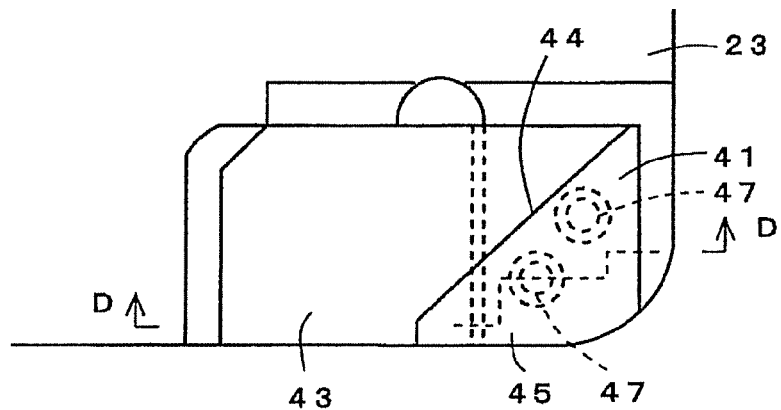
FIG. 7A is an enlarged view of the C part in FIG. 5A.
Figure 7B:
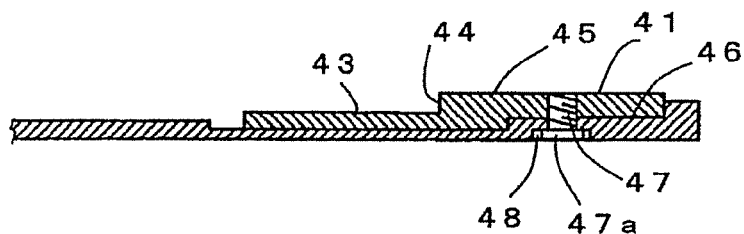
FIG. 7B is a sectional view taken along the line D-D in FIG. 7A.

On the distal ends of the upper surface of the fork 23, there are disposed regulation pieces 41 for regulating the peripheral portion of the wafer so as not to allow the wafer to move in the distal direction (right direction in FIG. 5A) and the right and left direction (the up and down direction in FIG. 5A). In addition, on the proximal side of the fork 23, there is disposed a gripping mechanism 42 capable of moving forward and rearward so as to grip the wafer w between the gripping mechanism 42 and the regulation pieces 41, so as not to allow the wafer to move in the rear direction. As shown in FIGS. 7A and 7B, the regulation piece 41 includes a horizontal receiving surface 43 capable of supporting the lower surface of the wafer even when the distal side (right side in FIG. 5A) of the wafer is bent by its own weight, and a projecting part 45 having a regulation surface 44 that is projected upward from the receiving surface 43 so as to regulate the peripheral portion of the wafer.

A positioning groove 46 for positioning each regulation piece 41 is formed in the distal upper surface of the fork 23. The regulation piece 41 is detachably mounted on the fork 23 from the lower surface thereof by a small screw 47. In this case, in order that a head 47a of the small screw 47 does not project from the lower surface of the fork 23, a recess 48 for accommodating the head 47a of the small screw 47 is formed in the lower surface of the fork 23. Preferably, the regulation piece 41 is made of a heat-resistant resin such as a PEEK material.

The gripping mechanism 42 includes a contact member 42a to be brought into contact with the rear peripheral portion of the wafer w, and an air cylinder 42b as a driving means for causing the contact member 42a to move forward and rearward. A mapping sensor for detecting and mapping positions of the wafers in the boat may be disposed on the distal end of the fork 23.

Next, an operation of the vertical thermal processing apparatus 1 as structured above is described below. At first, a plurality of wafers W are transferred from the container 21 to the ring-shaped support plates 13 on the boat 9. At this time, the transfer mechanism 24 firstly causes the plurality of forks 23 to move forward so that the plurality of forks 23 are inserted into the container 21. Then, the plurality of wafers w are placed on the upper surfaces of the respective forks 23, and the respective forks 23 grip the respective wafers w. Then, the forks 23 gripping the wafers w are drawn from the container 21. Then, the transfer mechanism 24 changes the orientation of the forks 23 from the side of the container 21 to the side of the boat 9, and causes the respective forks 23 to move forward so that the forks 23 are inserted between the ring-shaped plates 13, 13, which are arranged in a tier-like manner in the up and down direction. Thereafter, by lowering the forks 23, the wafers w are placed on the ring-shaped support plates 13 (in more detail, on the substrate support pieces 18). After that, the forks 23 are retracted.

Disposed on the upper surface of each fork 23 are the support projections 34, which can horizontally support the wafer w. The support projections 34 are provided only at the two substantially central positions and the one rear position in the fore and aft direction. Thus, the load (weight) of the wafer w is not supported by the distal end of the fork 23. Thus, a bending amount on the distal side of the fork 34 is reduced. Therefore, it is not necessary for the fork 23 to have a large thickness in order to restrain the bending. Namely, the thickness of the fork is also reduced. Since the bending amount of the fork 23 and the thickness of the fork 23 can be reduced, the plurality of wafers can be transferred to the boat with narrower pitches, whereby the number of wafers to be processed per boat in the vertical thermal processing apparatus 1 can be increased. To be specific, the number of wafers to be processed can be increased from about seventy five, which is a conventional example, to about one hundred.

Further, by providing the step in the lower surface of the fork 23 at the region more distal than the substantially central support projections 34, the thickness tc of the distal side region can be formed smaller than the thicknesses ta and tb of the other parts, whereby the thickness of the fork 23 can be reduced. Furthermore, in this example, due to the provision of the step 49 in the lower surface of the intermediate part of the fork 23, the thickness of the fork 23 can be formed smaller from the proximal side in a stepwise manner, whereby the thickness of the fork 23 can be further reduced. Therefore, the wafers can be transferred to a boat of further narrower pitches.

In addition, since each of the support projections 34 is made of a PEEK material and is formed into the flat, small circular shape, the wafer w can be brought into contact with only small areas or points but can be stably supported, without increasing the substantial thickness of the fork 23. In addition, the fork 23 has the substantially U-shape in plan view, with the substantially central support projections 34 being disposed on the two right and left locations on the upper surface of the fork 23, and the rear support projection 34 being disposed on the one central location on the proximal side. Therefore, the wafer w can be stably supported by the three-point support manner.

Disposed on the distal upper surface of the fork 23 are the regulation pieces 41 that regulate the peripheral portion of the wafer so as not to allow the wafer to move in the distal direction and the right and left direction. In addition, disposed on the proximal side of the fork 23 is the gripping mechanism 42 capable of moving forward and rearward and of gripping the wafer w between the gripping mechanism 42 and the regulation pieces 41. Therefore, although the fork has only a small thickness, the fork can reliably grip the wafer and rapidly transfer the same. As a result, processing ability can be improved.

The boat 9 includes: the plurality of ring-shaped support plates 13 each having the annular plate 17 having a diameter larger than that of the wafer w and the plurality of substrate support pieces 18 projecting from the annular plate 17, the ring-shaped support plate 13 being capable of supporting the wafer w by locking the peripheral portion of the wafer w by the substrate support pieces 18 while maintaining a distance between the wafer w and the annular plate 17; and the plurality of support columns 16 disposed to surround the circumference of the ring-shaped support plates 13, the support columns 16 being capable of supporting the peripheral portions of the support plates 13 by means of the projections or grooves 20. Due to this structure, the wafers can be easily transferred without requiring a complicated mechanism. That is to say, the structure of the transfer mechanism 24 can be simplified.

After the wafers have been transferred to the boat 9 according to the manner as described above, the lid member 6 is elevated so that the boat 9 is loaded into the thermal processing furnace 3. Then, the wafers are thermally processed at a predetermined temperature, at a predetermined pressure, and under a predetermined gas atmosphere. Upon completion of the thermal process, the lid member 6 is lowered so that the boat 9 is unloaded from the thermal processing furnace 3 to the loading area 11. Then, the processed wafers are transferred from the boat 9 to the container 21 by the transfer mechanism 24 in the reverse order as described above.

Figure 9A:
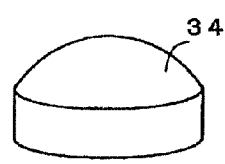
FIG. 9A is a perspective view schematically showing another shape of the support projection.
Figure 9B:
FIG. 9B is a perspective view schematically showing a further shape of the support projection.
Figure 9C:
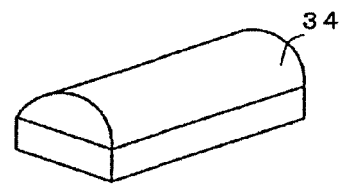
FIG. 9C is a perspective view schematically showing a further shape of the support projection.
Figure 9D:
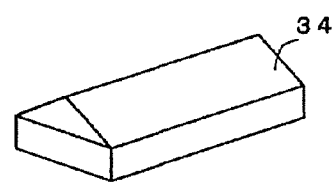
FIG. 9D is a perspective view schematically showing a further shape of the support projection.

Although the one embodiment of the present invention has been described in detail with reference to the drawings, the present invention is not limited to the aforementioned embodiment, and can be variously modified within a scope not departing from the concept of the present invention. For example, a ring boat of narrow pitches as described in Japanese Patent Publication No. 3234617 may be used as the boat. The support projection 34 may have one of the following shapes. As shown in FIG. 9A, the support projection 34 may have a lower cylindrical part and an upper convex part. As shown in FIG. 9B, the support projection 34 may have a lower cylindrical part and an upper conical part. As shown in FIG. 9C, the support projection 34 may have a domed roof shape. As shown in FIG. 9D, the support projection 34 may have a triangular roof shape. Moreover, the present invention can be applied to a processing apparatus including a transfer mechanism of a single-substrate transfer type, which transfers substrates to be processed one by one, by placing the substrate on an upper surface of a transfer plate and transferring the substrate while holding the horizontal posture of the substrate.

The invention claimed is:

1. A processing apparatus comprising:
    a transfer mechanism including at least one transfer plate, whereby when a substrate to be processed is placed on an upper surface of the transfer plate, the transfer mechanism causes the transfer plate to move while maintaining the substrate to be processed placed horizontally thereon, the transfer plate comprising
        a cantilevered support structure horizontally extending from a proximal end thereof to a distal end thereof in a fore and aft direction, and
        a plurality of support projections provided on an upper surface of the transfer plate and configured to horizontally support the substrate to be processed at a substantially central position of the transfer plate and a rear position proximate the proximal end of the transfer plate;
    wherein a bottom surface of the substrate to be processed is not supported by the upper surface of the transfer plate or by the support projections over a distance between the support projection located in the substantially central position of the transfer plate and the distal end of the transfer plate, and
    wherein the transfer plate is provided with a step in a lower surface thereof at a region more distal than the substantially central support projection, so that a thickness of this region is smaller than a thickness of the other region.

2. A processing apparatus according to claim 1, wherein each of the plurality of support projections is made of a heat resistant resin, and is formed into a flat, circular shape.

3. The processing apparatus according to claim 1, wherein the transfer plate has a substantially U-shape in plan view;
    the support projections at the substantially central position are disposed on two right and left locations on the upper surface of the transfer plate; and
    the support projection at the rear position is disposed on one central location on a proximal side of the transfer plate.

4. The processing apparatus according to claim 1, wherein the upper surface of the transfer plate on the distal end is provided with a regulation piece that regulates a peripheral portion of the substrate to be processed so as not to allow the substrate to be processed to move in the forward direction and the right and left direction; and
    the upper surface of the transfer plate on a proximal side is provided with a gripping mechanism capable of moving forward and rearward so as to grip the substrate to be processed between the gripping mechanism and the regulation piece, so as not to allow the substrate to be processed to move in the rear direction.

5. A vertical thermal processing apparatus comprising:
    a substrate supporter capable of supporting a plurality of substrates to be processed at predetermined intervals therebetween in a vertical direction;
    a transfer mechanism including at least one transfer plate configured to transfer a plurality of substrates to be processed between the substrate supporter and a container capable of containing a plurality of substrates to be processed; and
    a thermal processing furnace configured to thermally process the plurality of substrates to be processed that have been loaded thereinto together with the substrate supporter;
    wherein the transfer plate comprises
        a cantilevered support structure horizontally extending from a proximal end thereof to a distal end thereof in a fore and aft direction, and
        a plurality of support projections provided on an upper surface of the transfer plate and configured to horizontally support the substrate to be processed at a substantially central position of the transfer plate and a rear position proximate the proximal end of the transfer plate;

wherein a bottom surface of the substrate to be processed is not supported by the upper surface of the transfer plate or by the support projections over a distance between the support projection located at the substantially central position of the transfer plate and the distal end of the transfer plate, and wherein the transfer plate is provided with a step in a lower surface thereof at a region more distal than the substantially central support projection, so that a thickness of this region is smaller than a thickness of the other region.

6. The vertical thermal processing apparatus according to claim 5, wherein each of the plurality of support projections is made of a heat resistant resin, and is formed into a flat, circular shape.

7. The vertical thermal processing apparatus according to claim 5, wherein the transfer plate has a substantially U-shape in plan view;

the support projections at the substantially central position are disposed on two right and left locations on the upper surface of the transfer plate; and the support projection at the rear position is disposed on one central location on a proximal side of the transfer plate.

8. The vertical thermal processing apparatus according to claim 5, wherein the upper surface of the transfer plate on the distal end is provided with a regulation piece that regulates a peripheral portion of the substrate to be processed so as not to allow the substrate to be processed to move in the forward direction and the right and left direction; and the upper surface of the transfer plate on a proximal side is provided with a gripping mechanism capable of moving forward and rearward so as to grip the substrate to be processed between the gripping mechanism and the regulation piece, so as not to allow the substrate to be processed to move in the rear direction.

* * * * *